United States Patent
Dennis et al.

(10) Patent No.: US 6,903,619 B2
(45) Date of Patent: Jun. 7, 2005

(54) ELECTROMAGNETIC WAVE TRANSMITTER SYSTEMS, METHODS AND ARTICLES OF MANUFACTURE

(75) Inventors: Anthony Dennis, Belle Mead, NJ (US); Yongwen Yang, Hillsboro, NJ (US); Walid Ahmed, Tinton Falls, NJ (US); Radwan Husseini, Annadale, NJ (US); David Bengtson, Easton, PA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/454,698

(22) Filed: Jun. 4, 2003

(65) Prior Publication Data

US 2004/0247047 A1 Dec. 9, 2004

(51) Int. Cl.$^7$ .................................................. H03K 7/04
(52) U.S. Cl. ........................ 332/112; 332/151; 332/149; 332/115; 332/119; 332/120; 332/145; 332/105; 375/298
(58) Field of Search ........................... 375/298; 332/112, 332/151, 149, 115, 119, 120, 145, 105

(56) References Cited

U.S. PATENT DOCUMENTS 6,369,710 B1 * 4/2002 Poticny
6,738,432 B2 * 5/2004 Pehlke et al.

2002/0136325 A1   9/2002  Pehlke et al. .............. 375/300

FOREIGN PATENT DOCUMENTS

EP   1 056 248 A1   11/2000   ............ H04L/27/00
JP   401319309 A  * 12/1989

OTHER PUBLICATIONS

Rodriguez et al. "IGBT Inventor with Vector Modulation" IEEE International Symposium on Industrial electronics 1994 May 25–27 1994 pp 131–136.*
Gibisco "Handbook of Radio + Wireless Technology" McGraw Hill 1999 pp 91.*
Written Opinion, Applicant's or agent's file reference 18055 PCT, International application No. PCT/US03/31937, International filing dated Oct. 8, 2003, Priority dated Oct. 8, 2002, Date of Mailing Oct. 8, 2004.
Handbook of Radio & Wireless Technology, McGraw–Hill, A Division of The McGraw Hill Companies, Library of Congress Cataloging–in–Publication Data, 1998.

* cited by examiner

Primary Examiner—Michael Shingleton

(57) ABSTRACT

A transceiver and transmitter are shown. A baseband processor receives a signal for transmission. It converts the signal into amplitude and phase polar components. Each component is then processed—the phase component through a wideband phase modulator and the amplitude component through a wideband amplitude modulator, and the components are then recombined for further processing or transmission.

35 Claims, 3 Drawing Sheets

ELECTROMAGNETIC WAVE TRANSMITTER SYSTEMS, METHODS AND ARTICLES OF MANUFACTURE

FIELD OF THE INVENTION

The present invention relates to the transfer of electromagnetic waves. More particularly, the present invention relates to electromagnetic wave transmitters.

BACKGROUND OF THE INVENTION

Electromagnetic waves may be transferred from place to place through a conductor. In wired transmission, the conductor is usually a wire or other solid substance. In wireless transmission, the conductor is usually an ambient substance, such as air, water, etc. A transmitter typically converts electrical energy into a signal, which is then broadcast via carrier wave through an antenna to a receiver's antenna. Repeaters, middle stations, etc. may be used as intermediates in the transmission to sustain the integrity of the transmitted wave.

The electrical energy input into a transmitter usually results from some intelligence being generated by a sender, such as voice, data, etc. This intelligence is modulated onto a carrier wave by the transmitter. The now modulated carrier wave is the transmitted electromagnetic signal. A receiver may then demodulate the signal, by deconstructing the modulated carrier wave into a copy of the initial intelligence sent by the transmitter.

Various techniques are used to modulate the carrier wave. For example, carrier waves in wireless transmission may be modulated on to signals by varying wave characteristics, such as amplitude, frequency and phase. Linear techniques typically modulate frequency and/or phase and amplitude characteristics of a signal. Non-linear techniques typically modulate frequency and/or phase characteristics of a signal.

Digital or analog techniques or a combination of both may be used with linear or non-linear techniques. The nature of the signal—its envelope—may determine whether linear or non linear techniques are used. Constant envelope signals typically use a non-linear transmit technique while a more linear transmit technique is typically used for non-constant envelope signals.

These techniques are not necessarily distinct. For example, transmitters may need to support a combination of constant and non-constant envelope schemes such as when a transmitter is used for multiple modes of operation (e.g., GSM and EDGE). The need to support multiple pulse processing schemes has led to costly and inefficient architectures. Traditionally, multiple modulation schemes in a single transmitter have been provided through either single modulation architectures, which provide less than optimal solutions, or multiple modulation architectures, which increase cost and complexity of the transmitter.

Accordingly, it would be helpful to the art of electromagnetic transmission if transceiver, transmitter and receivers systems, methods and articles of manufacture could be provided that facilitate multiple modulation schemes.

SUMMARY OF THE INVENTION

The present invention comprises systems, methods and articles of manufacture for transmitting electromagnetic waves and signals. The preferred apparatus embodiments comprise a baseband processor for receiving a first signal and converting the first signal into polar coordinates, comprised of amplitude and phase components; a wideband phase modulator for processing the phase component of the first signal via modulation upon a carrier wave; and a wideband amplitude modulator, comprised of independently controllable current sources, for processing the amplitude component of said first signal.

The phase component is then provided to the wideband amplitude modulator for amplification according to any control imposed on the current sources and a second signal is generated that is comprised of the phase component and amplitude component of the first signal.

BRIEF DESCRIPTION OF THE DRAWINGS

For the purpose of illustrating the invention, there is shown in the drawings at least one form which is presently preferred; it being understood, however, that this invention is not limited to the precise arrangements, methods and instrumentalities shown.

DETAILED DESCRIPTION OF THE INVENTION

Figure 1:
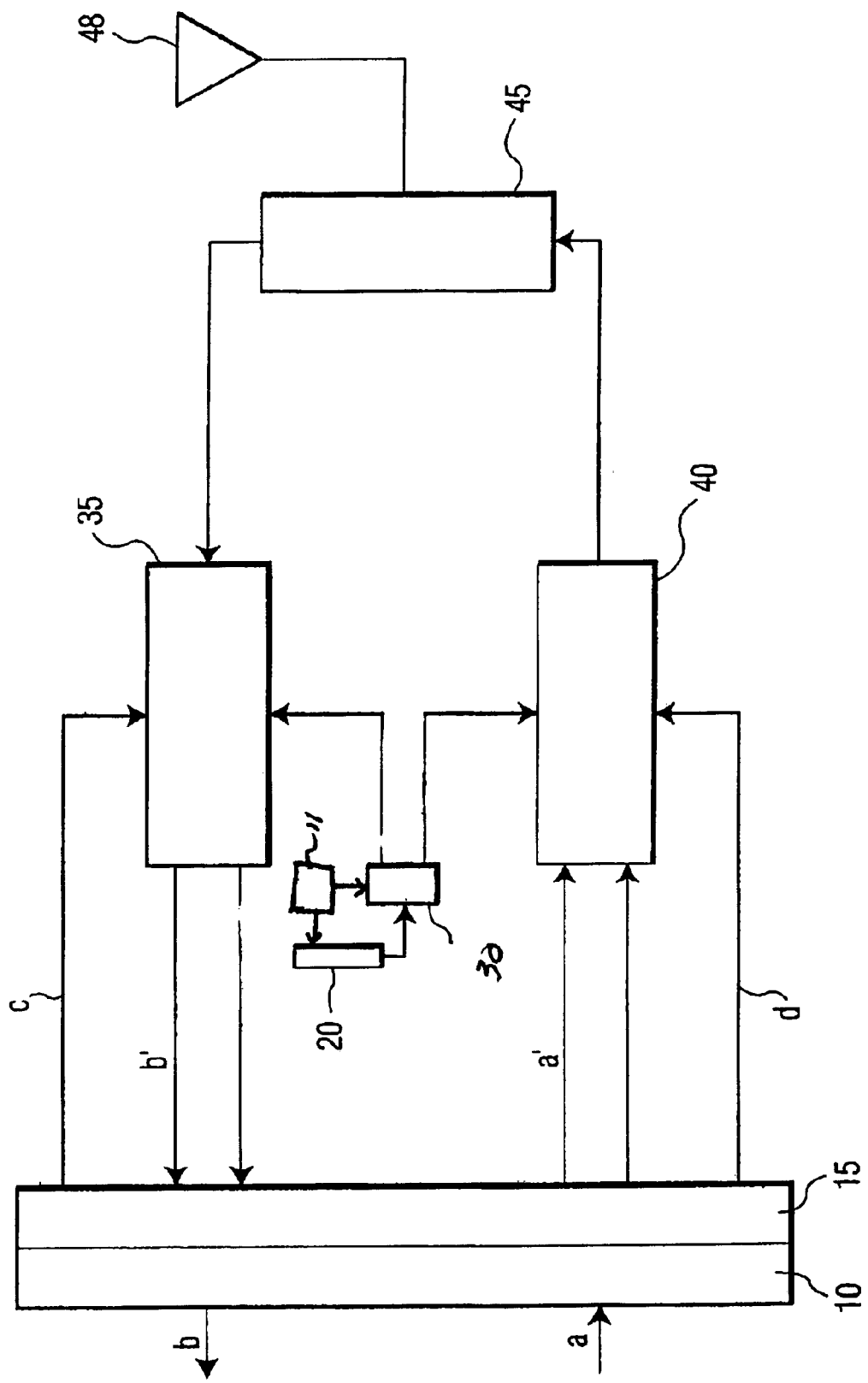
FIG. 1 shows a preferred embodiment of the present invention.

Embodiments of the present invention include apparatus, methods and articles of manufacture for transmitting electromagnetic waves and signals. Embodiments of the invention may be entirely comprised of hardware, software and/or may be a combination of software and hardware. Accordingly, individual blocks and combinations of blocks in the drawings support combinations of means for performing the specified functions and/or combinations of steps for performing the specified functions. Each of the blocks of the drawings, and combinations of blocks of the drawings, may be embodied in many different ways, as is well known to those of skill in the art.

In the especially preferred embodiments, the transmitter is specialized for particular applications, however, combinations of applications may also be desired in a particular embodiments. Applications include but are not limited to: CDMA, CDMA2000, W-CDMA, GSM, TDMA; and, other types of devices, both wired and wireless, e.g. Bluetooth, 802.11a, -b, -g, GPS, radar, 1xRTT, radios, GPRS, computers and computer communication devices, handheld devices, etc.

It should be noted that the word "signal" is used herein to describe an electromagnetic wave that has been modulated in some fashion, usually by the impression of intelligence upon the wave, for example imposing data upon a carrier wave. It should also be noted that the use of "signal" and "wave" in the singular includes the plural (or multiple signals and waves respectively) as often transmitters generate more than one signal and/or wave in the normal course of their operation. It should also be noted that embodiments of the present invention might be used as well to input and/or output waves, as well as signals, as is further described below. It should also be noted that the word "pulse" is used herein to describe components of a signal, so that a signal, for example, is comprised of one or more pulses. Accordingly, signal, pulse, signal processing and pulse processing may be used interchangeably herein. It should also be noted that the term "line" may be used interchangeably with "interface" herein, and either term is to be defined as a path for a signal.

In the preferred embodiments, digital signal processing techniques are combined with analog RF circuits to obtain modulation across multiple modulation techniques, such as GMSK used in GSM, GFSK used in DECT and Bluetooth, 8-PSK used in EDGE, OQPSK and HPSK used in IS-2000, π/4 DQPSK used in TDMA and OFDM used in 802.11.

The signal envelope processing which occurs in the preferred embodiments is independent of the specific characteristics of the baseband signal (e.g., constant and non-constant envelope.) As was described above, various preferred embodiments of the invention, therefore, first convert a signal into polar coordinates, digitally process the phase and amplitude components of the signal, and then reconstruct the signal post processing of the phase and amplitude components of the signal.

The reconstruction of the phase and amplitude components provides processing flexibility as is described further herein. For example, non-linear type techniques may be used for the processing of phase component of the signal, because the phase component provides a relatively constant signal envelope for non-linear processing. Thus the transmitter efficiency may be increased over those using linear type techniques.

Digital processing, of amplitude and phase signals, e.g., pulse shaping and/or image suppression techniques, are used to provide targeting of a transmission spectrum, minimize adjacent channel interference and other undesired noise and provide other benefits. For example, pulse shaping helps achieve spectrally efficient transmission. For example in the preferred embodiments, in a CDMA environment, pulse shaping with an associated spectral mask minimizes ACPR.

Digital processing also provides flexibility and control in processing the signal through the transmitter. For example, digital processing of the amplitude component assists in providing the flexibility to support multiple pulse processing schemes. Digital processing of the amplitude and phase components also assists in shaping the output spectrum of the transmitter, which assists in providing wideband noise suppression—thus minimizing (and in some embodiments eliminating) RF pass-band filtering. As yet another example, digital processing of the amplitude component provides for the ability to manipulate the signal envelope statistics (or level) in order to increase the output power dynamic range while maintaining appropriate in-band signal quality specifications. (Of course, in a constant envelope pulse processing scheme embodiment such as GMSK, signal envelope processing may be limited to varying a fixed envelope level to achieve additional output power dynamic range.)

Moreover, the preferred embodiments provide reconfigurable pulse processing aspects of various embodiments. This assists the achievement of relatively spectrally efficient transmission for different constant and non-constant envelope signals (e.g., GMSK, HPSK, OQPSK, OFDM, etc.) So, for example, transceivers and transmitters of the preferred embodiments may be used to transmit CDMA signals, which are modulated via amplitude and phase pulse processing schemes, and so considered non-constant envelope signals, as well as be reconfigured, (e.g., using a programmable pulse shaping FIR structure) in order to transmit GSM signals, which are modulated via frequency or phase modulation and so may be considered constant envelope signals. It is also possible, in other embodiments, to use a base modulation approach by reconstruction in the baseband using digital to analog converters and then modulate at the Wideband Amplitude Modulator. It also may be desired to implement reconfigurable modulation, in various embodiments, at a Baseband Processing stage.

FIG. 1 shows a transceiver of a preferred embodiment. A Baseband processor 10 provides signals for transmission, e.g. a, or receives signals to be processed by higher level applications, e.g., b. Baseband Processor 10 is as known in the art, e.g. a digital signal processor (15) and microcontroller. It should be noted that, in other embodiments, other signal providers/receivers may be used, e.g., an analog signal provider, a digital signal provider, etc. and therefore, a Baseband processor per se may not be necessary. Additionally, a modified processor, e.g., one without a digital signal processor component, may be used.

In the preferred embodiments, a Power Management module (not shown) is present. The Power Management module dynamically turns on and off various components in the transmitter in order to conserve power. The Power Management module executes its decision to turn on/off a certain component according to various criteria, for example, a predetermined inactivity period, input from external events such as a predefined output power level, gating control signal from Baseband Processor, etc. The Power Management module may control any of a number of other components. For example, a power management operation may turn on/off a Baseband Processor, a PLL, and an amplifier, in a preferred sequence, when a "transmit gate on/off" signal is issued by the system.

In the transmission segment, Digital Signal Processor 15, passes the digitized signals to two channels a', comprised of an I (in-phase or phase) component and Q (quadrature) component. These components provide the I,Q pulses to transmitter 40, as will be further described below. In the reception segment, received I,Q signals are provided to the Baseband processor 10 along channel b'. One or more power control signals, based upon the input signal, are also provided to receiver 35 and transmitter 40 via lines c and d, respectively. In other embodiments, power control may be supplied by other means, e.g. other components contained within the transmitter embodiment.

One or more power control signals, based upon the input signal, is passed via a Power Control Interface 11 to Voltage Gain Amplifier 20 (which may be a Variable Gain Attenuator in some embodiments) and Amplifier 30. Power Control Interface 11 may function as a controller in this and other preferred embodiments. For example, if Amplifier 30 comprises one or more biasing stages, such as, for example, three biasing stages, each biasing stage will have an associated control port (not shown here) $s_{c1}$, and $s_{c2}$, and $s_{c3}$. In this embodiment, Power Control Interface 11 functions as a controller, and is communication with control ports $s_{c1}$, and $s_{c2}$, and $s_{c3}$ of the three biasing stages. In general, Power Control Interface 11 may be used to regulate each biasing stage to control gain of the Amplifier 30, and output of the amplifier. In other embodiments, power control may be supplied by other means, e.g. transmitter 40 and/or other components contained within the transmitter embodiment.

Returning now to the embodiment of FIG. 1, transmitted and received signals are provided to and from switchplexer 45, and in turn to and from antenna 48.

Figure 2:
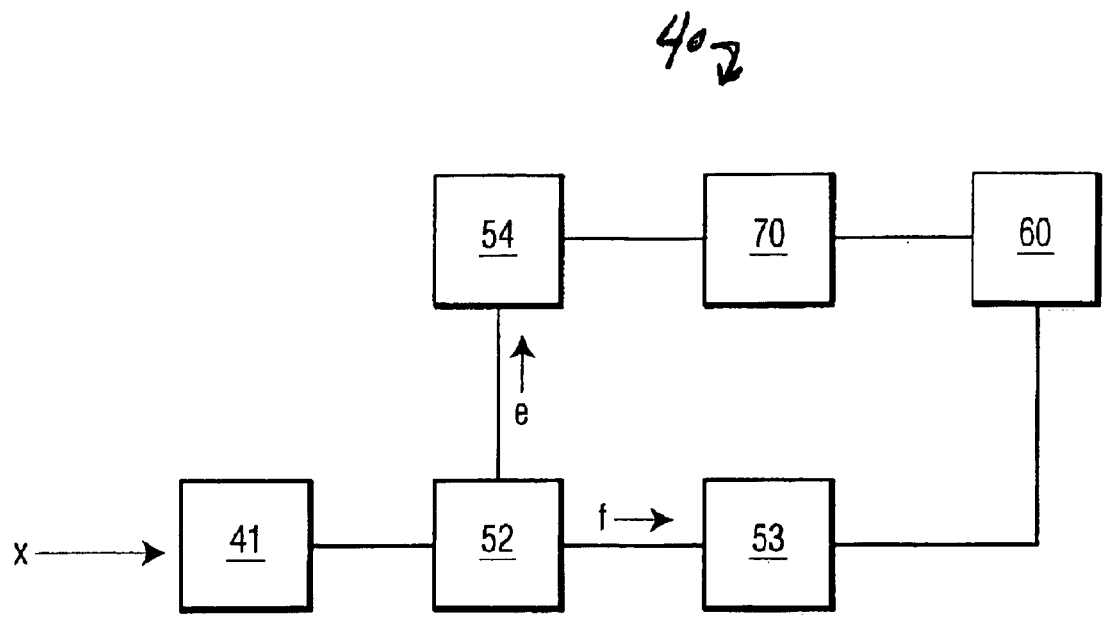
FIG. 2 shows a preferred embodiment of the present invention.

Turning now to FIG. 2, transmitter 40 is shown in more detail. Signals are generally fed into transmitter 40 from direction x. As noted above, in this embodiment and other preferred embodiments, digital I/Q signals are fed into the transmitter. It should be noted, however, that in other embodiments, e.g. analog IQ, signal digitization may be accomplished within a transmitter.

Digitization of the signal results in a signal with In-Phase (I) and Quadrature (Q) components, also referred to herein as rectangular signal coordinates. Various filtering and other techniques may be applied to the I,Q signal in this and other embodiments. For example, as shown in the embodiment of FIG. 2, Pulse Processing component 41 is used to shape the data for spectrally efficient transmission, that is, so that there is minimal possible spill over to adjacent frequencies. Pulse Processing component 41 is implemented, in the preferred embodiments, as a finite impulse response (FIR). Other envelope pulse processing techniques that are known in the art may also be used, e.g. an infinite impulse response (IIR) filter, etc. The preferred embodiment of an FIR may include a configurable number of taps and programmable filter coefficients to support different digital modulation schemes.

The rectangular signal coordinates are then converted to polar coordinates, by polar processing component 52, with phase component e and amplitude component f, for further processing. In the especially preferred embodiments, translation is implemented via a CORDIC algorithm. In some preferred embodiments, AM/AM and/or AM/PM correction or modification may be implemented, post translation in order to, inter alia, address RF non-linear effects.

Phase component e and amplitude component f are then processed through separate paths. In this and other preferred embodiments, phase component e and amplitude component f are digital signals but either or both may be converted to analog signals if desired, through various means as is known in the art.

Phase component e, is fed to Equalizer 54, which is a modulation compensation (equalization) filter. (It should be noted that, phase component e comprises a relatively constant signal envelope for non-linear processing.) Equalizer 54 provides modulation compensation, by having a magnitude and phase response that is the inverse of the closed loop response of Wideband Phase Modulator 70. The bandwidth of Wideband Phase Modulator 70 may need to be limited (e.g. to less than the modulation bandwidth) in order to minimize noise in the output spectrum. Limiting the bandwidth in this manner, however, may attenuate the higher frequency components of the signal. Equalizer 54 compensates for this, if necessary, by increasing the gain of these higher frequency components, thus producing a flat frequency response over the modulation bandwidth of the signal and effectively extending the modulation bandwidth. Equalizer 54 is preferably implemented digitally, and may be either a FIR (finite impulse response) or IIR (infinite frequency response) filter, as examples. Equalizer 54 may also be implemented with programmable coefficients as desired, or other components as desired.

It must be noted that the components as described herein are not to be considered restrictedly. That is, due to the nature of digital signal processing, where building blocks may be used in various configurations, any component may be used in a number of functional configurations as desired. For example, Equalizer 54 may be implemented within a Wideband Phase Modulator 70, if desired.

In the Wideband Phase Modulator 70 used in the preferred embodiments, appropriate frequency modulation occurs of the phase component, which is the baseband phase information, of the input signal onto a RF carrier wave. Thus, the output of the Wideband Phase Modulator 70 of the preferred embodiments is an electromagnetic wave that has a constant amplitude or envelope characteristic, as well as a frequency or phase characteristic that now varies from its original value in relation to the phase component of the input signal. A power control signal may be used to adjust signal output, e.g. provide a fixed output, adjust the output, etc., as well.

Insofar as the Wideband Phase Modulator 70 of the preferred embodiment modulates the signal onto the RF carrier, it also provides appropriate raster resolution and frequency band and channel selection in multiple band transmitters and transceivers. Moreover, a phase calibration component may be used in the especially preferred embodiments to ensure that phase modulation quality is maintained within the targeted transmission specification over various design tolerances. In other embodiments, a Wideband Phase Modulator 70 as known in the art may be used, for example, Translational Loop, Direct Digital Synthesis, etc. may be used in various embodiments.

Figure 3:
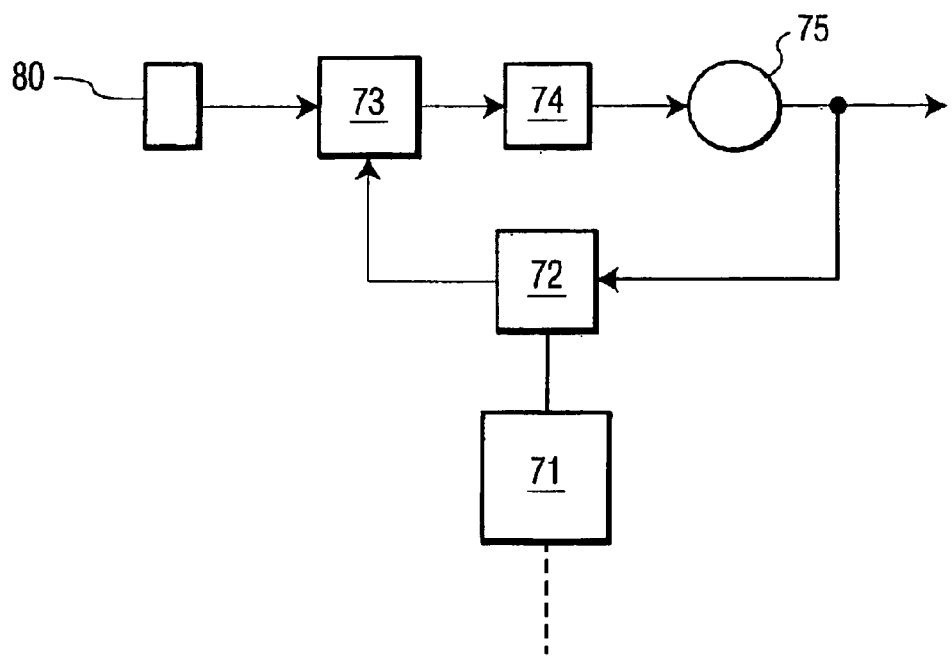
FIG. 3 shows a preferred embodiment of the present invention.

FIG. 3 shows Wideband Phase Modulator 70 of FIG. 2 in more detail. Wideband Phase Modulator 70 is comprised of Sigma Delta Modulator (SDM) 71, Fractional Divider 72, Phase-Frequency Detector 73, Low-Pass Loop Filter 74 and Voltage Control Oscillator 75.

Reference Source 80 is preferably used to provide a stable phase and frequency reference for the fractional divider 72 output. Reference Source 80 may be any source of electromagnetic waves that is capable of producing a carrier wave, with a stable phase and frequency reference.

Sigma-Delta Modulator (SDM) 71 is used to achieve wideband phase modulation of the phase component of the input signal onto a carrier wave. In this as well as other preferred embodiments, a 3rd Order Sigma-Delta Modulator is used in conjunction with a PLL (comprised generally of 72, 73, 74 and 75) and Equalizer 54 to achieve wideband phase modulation and channel selection. SDM 71 pushes out the noise floor where it can be adequately filtered by the low-pass loop filter of the PLL. As the achievable bandwidth of the SDM/PLL may be limited to less than the modulation bandwidth to minimize close-in phase noise, Equalizer 54 has a magnitude and phase response that is the inverse of the closed loop response of the combined PLL and 5 DM. Thus the modulation bandwidth of the Wideband Phase Modulator 70 may be extended. SDM 71 may also facilitate close control of the delay variability of the phase signal, thus improving system performance.

SDM 71 is preferably comprised of one or more of a series of adders/accumulators and feedback components for inputting the fractional phase/channel number data and outputting a digitized series of integers. SDM 71 is preferably configured in the present embodiment in such a manner that the input range is sufficient for phase data as well as the fractional portion of a channel number. The output frequency of Voltage Control Oscillator 75 is divided by some number, N, which is the divider value of 72. The output of 71 is used to dither the divider value of 72. The dithering of the Divider 72 allows for a fractional multiplication factor to be realizable.

Phase-Frequency Detector 73 compares the relative phases of the two signals and outputs a signal that is proportional to the difference between them. This output signal is used to adjust the frequency of Voltage Control Oscillator 75 so that the phase difference measured at the phase detector 73 tracks to zero. Hence, the phase of the signal is locked by the feedback loop to prevent unwanted drift of the signal phase due to variations or distortion in the phase and frequency of Voltage Control Oscillator 75. The output of Voltage Control Oscillator 75 is related to the output of Reference Source 80 by a multiplication factor. This divider is required due to the relatively high frequency of Reference Source 80 coupled with the small channel resolution requirement of the various industry standards.

A feedback signal from Voltage Control Oscillator 75 is passed through Divider 72. The phase component information received from Sigma-Delta Modulator 71 is used to dither the divider between a range of divider values. The dither of the divider value is the mechanism through which the phase information is modulated onto the carrier. The resulting signal is passed to Phase-Frequency Detector 73, where it is compared with the reference signal from Reference Source 80, as noted above. This comparison result is passed through Low-Pass Loop Filter 74, where it is used to generate the phase modulated carrier wave signal via Voltage Control Oscillator 75, which is then transmitted to Wideband Amplitude Modulator 60 for reconstruction with amplitude component f.

The phase-modulated carrier wave signal may be, in some preferred embodiments, although not illustrated here, passed through a Variable Gain Attenuator (VGA) before reconstruction, or other modifier (e.g., Voltage Gain Amplifier) to modify some characteristics such as gain and/or frequency response of the signal to meet the dynamic range and emissions requirements in output power for the applicable industry standards. Band-pass filtering may also be used in some embodiments to further limit wideband noise emissions.

The phase-modulated carrier wave signal is then fed to Wideband Amplitude Modulator 60, where it is reconstructed with amplitude component f. Before describing that reconstruction, it would be helpful to review the processing of amplitude component f in the embodiment of FIG. 2.

Returning to FIG. 2, amplitude component f is fed to Spectral Shaping Component 53. Spectral Shaping Component 53 processes amplitude component f in order to shape the output spectrum as needed, for example, to flexibly support multiple processing schemes, as is further described below. A Spectral Shaping Component, in this and other embodiments, may also correct or modify the amplitude component as desired, e.g., removing unwanted wideband signal noise. For example, a Spectral Shaping Component may be implemented as a Look Up Table, (LUT) which reconstructs the signal according to entries contained within the table. Other embodiments may use a low-pass filter, such as a FIR, an infinite impulse response (IIR) filter, an analog filter, etc.

Returning now to the embodiment of FIG. 2, from Spectral Shaping Component 53, amplitude component f, which may be thought of as a digitized non-constant envelope signal, is fed to Wideband Amplitude Modulator 60. (It may be converted to analog in some embodiments if desired.)

Wideband Amplitude Modulator 60 modulates the baseband amplitude signal onto an RF carrier through reconstruction of the amplitude signal onto a phase modulated RF carrier. Wideband Amplitude Modulator 60 is, in this and other preferred embodiments, capable of modulating signals with differing bitwidth resolutions. Predistortion factors may be provided as well, if desired, as well as dynamic manipulation of bias controls to vary gain and resulting output power dynamic range.

Figure 4:
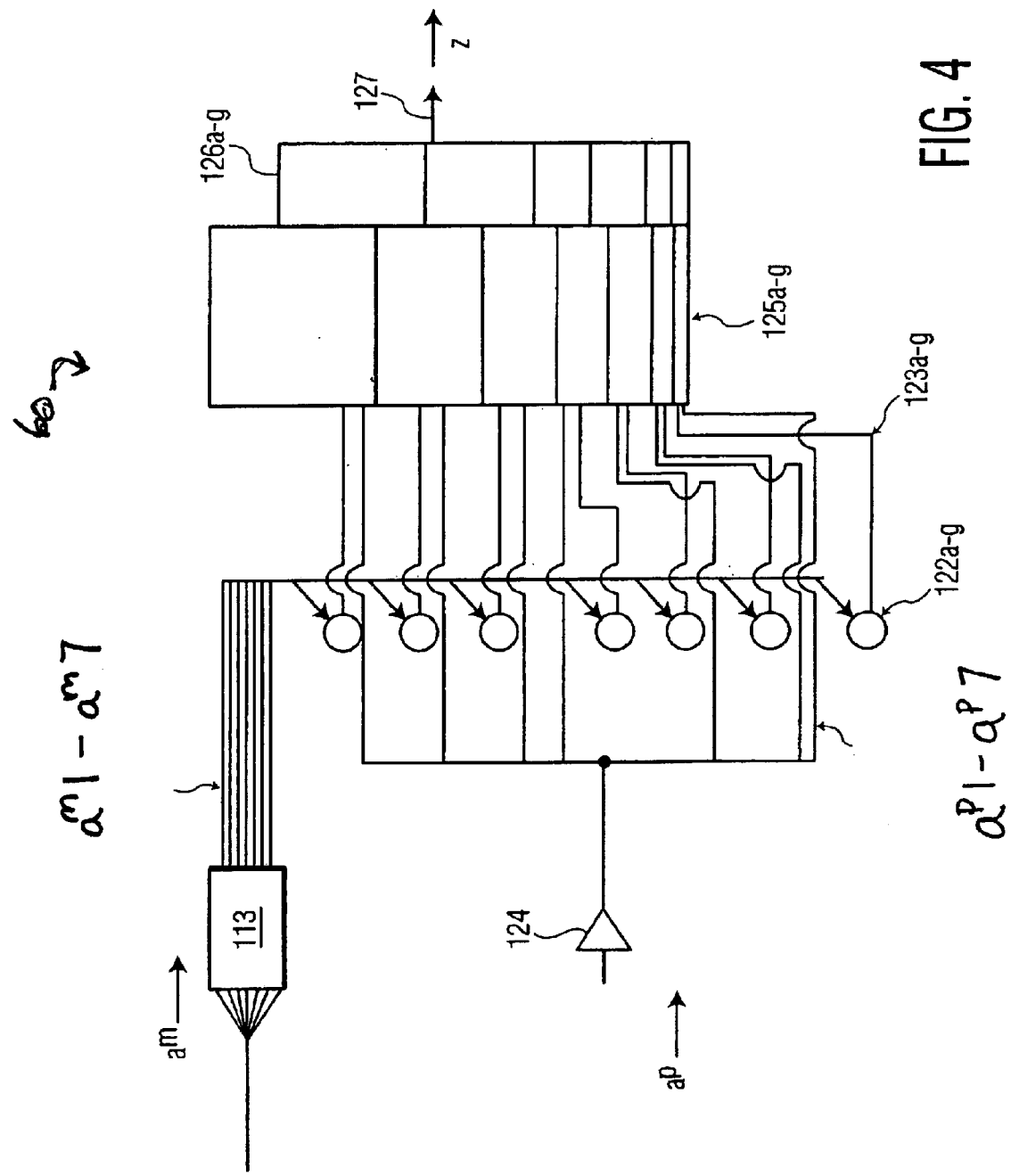
FIG. 4 shows a preferred embodiment of the present invention.

Turning now to FIG. 4, which is an illustration of the Wideband Amplitude Modulator 60, amplitude component f of the input signal is converted, via converter II 3, along path a', into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input signal. The digital word provides instruction signals or controls for attenuation and/or amplification, in manner to be described further below. Of course, as is described further below, in other embodiments, a differently composed digital word may be used, as well as other types of derivation and/or provision of amplitude or other signal characteristics.

Seven control component lines $a^m1$–$a^m7$ are shown leading away from the converter 113. The number of these control component lines depends, in the preferred embodiments, upon the resolution of the word. In this preferred embodiment, the word has a seven bit resolution. It should be noted in FIG. 4 that, for ease of viewing the figure, the control component lines are consolidated into a single path e leading into control components 122a–g. However, in the embodiment, and as further described below, the control component lines are not consolidated and instead feed into the control components individually.

Path $a^m$ (comprised of control component lines $a^m1$–$a^m7$ as described above) terminates in control components 122a–g. In the especially preferred embodiment, these are switching transistors, and are preferably current sources. Control components 122a–g are switched by bits of the digital word output from the amplitude component and so regulated by the digital word output from the amplitude component. If a bit is "1" or "high," the corresponding control component is switched on, and so current flows from that control component to appropriate current source 125a–g along bias control lines 123a–g. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 125a–g receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Reconstruction of the phase and amplitude components occurs, as had been noted above, within Wideband Amplitude Modulator 60. The phase component, traveling along path 2, has a constant envelope, i.e., it has no amplitude variations, yet it has phase characteristics of the original input signal x. The phase component passes to driver 124, and in turn driver lines $a^p1$–$a^7$, from where it is fed into current sources 125a–125g, and will serve to potentially drive current sources 125a–125g, as is further described below.

It should be noted that, in the present embodiment, transistors may be used as current sources 125a–125g. Additionally, in other embodiments, one or more transistors segmented appropriately may be used as current sources 125a–125g.

Each current source serves as a potential current source and is capable of generating a current, which is output to current source lines 126a–g respectively. Each current source may or may not act as a current source, and so may or may not generate a current, because it is regulated via the appropriate instruction signal, or digital word value regulating a control component. Activation of any segment, and generation of current from that segment, is dependent upon the value of the appropriate bit from the digital representation of the amplitude component regulating the appropriate control component. It should be noted that the current sources are not an amplifier or amplifiers, in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates. There may be, in some embodiments, one or more additional amplifiers in a wideband amplitude modulator.

The combined current, i.e. the sum of any current output from current sources 125a–g, after reconstruction through the phase and amplitude components, via lines 126a–g, is the current sources output. Thus the embodiment may act as an attenuator and/or amplifier and the power control is provided so as to achieve a dynamic range in output power required of various wireless standards. In other preferred embodiments, manipulating the bias controls of any amplification stage(s) may be done to change the gain in the path of the phase modulated carrier as well as the amplitude path.

No further circuitry or components are necessary between current sources to combine current from each current source and so provide a useful output current. Therefore, the combined current, which is output on line 127, and shown as z, may be used as desired, e.g., as an amplifier, as an attenuator, to drive a load, etc.

In the preferred embodiments, the current sources vary in current output and size. This provides various weighting to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources—of the same size—are provided, as well as current sources that vary in size. In yet other embodiments, other wave characteristics may be provided to other current sources and so regulate those sources.

It should be noted that, in the preferred embodiments, the current sources are biased non-linearly. Thus, any current source operates efficiently. In the preferred embodiments, therefore, power consumption is reduced. Additionally, as a result of current source regulation according to signal characteristics, as had been described above, the resultant output signal has a relatively accurate linearity and proportionality with the input signal. Thus, an amplifier may be provided in the preferred embodiments with the relative precision of linear operation combined with the relative efficiency and power consumption of non-linear operation.

There may be, in some embodiments, one or more additional amplifiers as desired. Additionally, other embodiments may use different amplifiers in addition to, and/or instead of, the amplifier shown in FIG. 4.

For example, returning to the embodiment of FIG. 4, if one of current sources 125a–g is switched on, it will act as a non-linear current source with attendant relative efficiency. If the current source is off, the source draws little or no power. Linear characteristics are seen as well because each current source that is on provides current contribution in similar proportions to the amplitude characteristic of the input signal, and so a relatively precise reproduction of the input signal is provided.

The current sources 125a–g comprise, in the preferred embodiment of FIG. 4, one or more HBT transistors. Other transistors may be used as well, such as FETS, etc., as well as other current sources. Other components may be interposed as well, e.g., a variable gain amplifier or attenuator to reduce the drive current to the transistor segments, non-linear components along the amplitude path, etc. Additionally, if analog, rather than digital signals are used in an embodiment, components may be used accordingly, e.g. analog representation would use a single segment.

It should be noted that, in the preferred embodiments, the digitization of the signal (for example, x in FIG. 2) provides more effective control over synchronization of the signals when reconstructed than might otherwise be obtainable. For example, control capacity and predictive capacity are increased over what might otherwise be obtained and, thus adjustment is possible using digital techniques.

Returning now to the embodiment of FIG. 2, an output is then produced from Wideband Amplitude Modulator 60 that represents an amplified carrier wave carrying any intelligence contained within the input signal. Linear amplification and/or attenuation across a relatively large frequency spectrum is possible with the embodiment and other preferred embodiments.

The reconstructed signal is then sent to antenna 48 for transmission. In other embodiments, the signal may pass to a load other than an antenna, or other components may be used as well or in addition to an antenna or load as desired, for example, for further processing or transmission. A load line may be chosen as well, as is known in the art, to provide an impedance match for a load. It is important to note however that impedance matching is not necessary between Wideband Amplitude Modulator 60 and a load, as Wideband Amplitude Modulator 60 is serving as a current source rather than a power source. Of course, in other embodiments, the signal may undergo further alteration, amplification, modification and/or processing upon being placed on a load or other line leading away from Wideband Amplitude Modulator 60.

Embodiments may utilize both analog and digital components, where desired, insofar as these embodiments manipulate waves and signals requiring both. For example, cell phone embodiments may utilize both analog and digital components. Various types of system architectures may also be utilized for constructing the embodiments. For example, embodiments or various components may be provided on a semiconductor device where desired, such as an integrated circuit or an application-specific integrated circuit composition; some examples include silicon (SI), silicon germanium (SiGe) or gallium arsenide (GaAs) substrates. Digital processing of the preferred embodiments allows for scalability as well—for example, the current drain and die area may be produced on any desirable chip size.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method for transmission comprising:
   processing a phase component of a first signal via a wideband phase modulator having an extendable signal processing range for modulation upon a carrier wave;
   processing an amplitude component of said first signal via a wideband amplitude modulator having an extendable signal processing range wherein said wideband amplitude modulator includes independently controllable current sources for independently modulating pre-selected components of said first signal;
   providing said phase component to said wideband amplitude modulator for amplification according to any control imposed by said wideband amplitude modulator upon said current sources; and,
   providing a second signal, comprised of said processed phase and amplitude components of said first signal, from said wideband amplitude modulator.

2. A method as in claim 1 further comprising converting said first signal into polar coordinates, comprised of amplitude and phase components.

3. A method as in claim 1 further comprising receiving said first signal, via a baseband processor.

4. A method as in claim 1 further comprising converting said first signal from an analog signal to a digital signal.

5. A method as in claim 1 wherein said baseband processor converts said first signal from an analog signal to a digital signal.

6. A method as in claim 1 wherein said second signal is provided from said wideband amplitude modulator using the modulation scheme of said first signal.

7. A method as in claim 6 wherein said second signal is provided from said wideband amplitude modulator using a selected modulation scheme, wherein said selected modulation scheme is different from the modulation scheme of said first signal.

8. A method as in claim 7 wherein said wideband amplitude modulator converts said second signal from a first modulation scheme to a second modulation scheme.

9. A method as in claim 1 wherein said phase component of said first signal is modulated onto said carrier wave using a selectable frequency for said carrier wave, wherein said selectable frequency corresponds to a wireless communication mode of operation.

10. A method as in claim 1 wherein said phase component is provided to said wideband amplitude modulator as a constant envelope signal.

11. A method as in claim 1 wherein said second signal is provided at an adjustable output power, said output power being adjustable in response to pre-selected environmental factors.

12. A method as in claim 11 wherein said output power is adjusted via a control signal.

13. A method according to claim 3, further comprising providing one or more power control signals to said baseband processor.

14. A method according to claim 1, further comprising providing one or more power control signals to said wideband phase modulator.

15. A method according to claim 1, further comprising providing one or more power control signals to said wideband amplitude modulator.

16. A method according to claim 15, further comprising generating one or more power control signals to one or more segments of said wideband amplitude modulator.

17. A method according to claim 1, further comprising managing power within said transmitter.

18. A transmitter comprising:
   a wideband phase modulator having an extendable signal processing range for processing said phase component of said first signal via modulation upon a carrier wave;
   a wideband amplitude modulator having an extendable signal processing range for processing said amplitude component of said first signal via wherein said wideband amplitude modulator is comprised of independently controllable current sources for independently modulating pre-selected components of said first signal;
   wherein said phase component is provided to said wideband amplitude modulator for amplification according to any control imposed by said wideband amplitude modulator upon said current sources; and, a second signal, comprised of said processed phase and amplitude components of said first signal, is provided from said wideband amplitude modulator.

19. A transmitter as in claim 18 further comprising a processor for converting said first signal into polar coordinates, comprised of amplitude and phase components.

20. A transmitter as in claim 18 further comprising a processor for digitizing said first signal.

21. A transmitter as in claim 18 further comprising a baseband processor for receiving a first signal.

22. A transmitter as in claim 18 wherein said first signal is converted from an analog signal to a digital signal in said baseband processor.

23. A transmitter as in claim 18 wherein said second signal is provided from said wideband amplitude modulator using the modulation scheme of said first signal.

24. A transmitter as in claim 23 further comprising means for providing said second signal using a selected modulation scheme, wherein said selected modulation scheme is different from the modulation scheme of said first signal.

25. A transmitter as in claim 24 further comprising means for reconfiguring said method for transmission from a first modulation scheme to a second modulation scheme.

26. A transmitter as in claim 18 wherein said phase component of said first signal is modulated onto said carrier wave using a selectable frequency for said carrier wave, wherein said selectable frequency corresponds to a wireless communication mode of operation.

27. A transmitter as in claim 18 wherein said phase component is provided to said wideband amplitude modulator as a constant envelope signal.

28. A transmitter as in claim 18 wherein said second signal is provided at an adjustable output power, wherein said output power is adjustable in response to pre-selected environmental factors.

29. A transmitter as in claim 28 wherein said output power is adjusted via a control signal.

30. A transmitter as in claim 21 further comprising a power control interface for providing one or more power control signals to said baseband processor.

31. A transmitter as in claim 18 further comprising a power control interface for providing one or more power control signals to said wideband phase modulator.

32. A transmitter as in claim 18 further comprising a power control interface for providing one or more power control signals to said wideband amplitude modulator.

33. A transmitter as in claim 18 further comprising a power management module for managing power within said transmitter.

34. An integrated circuit comprising:
- a baseband processor for receiving a first signal and converting said first signal into polar coordinates, comprised of amplitude and phase components;
- a wideband phase modulator having an extendable signal processing range for processing said phase component of said first signal via modulation upon a carrier wave;
- a wideband amplitude modulator having an extendable signal processing range for processing said amplitude component of said first signal via wherein said wideband amplitude modulator includes independently controllable current sources for independently modulating pre-selected components of said first signal;
- wherein said phase component is provided to said wideband amplitude modulator for amplification according to any control imposed by said wideband amplitude modulator upon said current sources; and, a second signal, comprised of said processed phase and amplitude components of said first signal, is provided from said wideband amplitude modulator.

35. A transceiver comprising:
- a transmitter comprising:
- a baseband processor for receiving a first signal and converting said first signal into polar coordinates, comprised of amplitude and phase components;
- a wideband phase modulator having an extendable signal processing range for processing said phase component of said first signal via modulation upon a carrier wave;
- a wideband amplitude modulator having an extendable signal processing range for processing said amplitude component of said first signal via wherein said wideband amplitude modulator includes independently controllable current sources for independently modulating pre-selected components of said first signal;
- wherein said phase component is provided to said wideband amplitude modulator for amplification according to any control imposed by said wideband amplitude modulator upon said current sources; and, a second signal, comprised of said processed phase and amplitude components of said first signal, is provided from said wideband amplitude modulator.

* * * * *